US012074578B2

(12) United States Patent  
Stegemann et al.

(10) Patent No.: US 12,074,578 B2  
(45) Date of Patent: Aug. 27, 2024

(54) METHOD AND DEVICE FOR ATTENUATING OSCILLATIONS ON BUS LINES OF A BUS SYSTEM BASED ON DIFFERENTIAL VOLTAGE SIGNALS

(71) Applicant: Robert Bosch GmbH, Stuttgart (DE)

(72) Inventors: Sebastian Stegemann, Tuebingen (DE); Steffen Walker, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 11 days.

(21) Appl. No.: 17/999,574

(22) PCT Filed: Apr. 21, 2021

(86) PCT No.: PCT/EP2021/060377  
§ 371 (c)(1),  
(2) Date: Nov. 22, 2022

(87) PCT Pub. No.: WO2021/233635  
PCT Pub. Date: Nov. 25, 2021

(65) Prior Publication Data  
US 2023/0223931 A1  Jul. 13, 2023

(30) Foreign Application Priority Data  
May 22, 2020 (DE) ..................... 10 2020 206 411.3

(51) Int. Cl.  
*H03H 11/24* (2006.01)  
*H04L 25/02* (2006.01)

(52) U.S. Cl.  
CPC ....... *H03H 11/245* (2013.01); *H04L 25/0272* (2013.01)

(58) Field of Classification Search  
None  
See application file for complete search history.

(56) References Cited

U.S. PATENT DOCUMENTS

| | | | |
|---|---|---|---|
| 7,196,566 B2* | 3/2007 | Kaiser, Jr. ............ | H03H 11/245 333/81 R |
| 10,651,825 B2* | 5/2020 | Chen .............. | H03K 19/018507 |
| 11,585,834 B2* | 2/2023 | Mutter ................... | G01R 1/203 |

FOREIGN PATENT DOCUMENTS

DE    102018206929 A1    11/2019

OTHER PUBLICATIONS

International Search Report for PCT/EP2021/060377, Issued Aug. 2, 2021.

(Continued)

*Primary Examiner* — Jeffrey S Zweizig  
(74) *Attorney, Agent, or Firm* — NORTON ROSE FULBRIGHT US LLP; Gerard A. Messina

(57) ABSTRACT

An attenuating device for a bus of a controller area network bus system based on differential voltage signals. The bus has first and second bus lines, having an attenuating circuit that provides a variable electrical resistance value between the first and second bus lines and that is operable in at least three circuit states. In a first circuit state, the first and second bus lines are connected via an attenuating resistor having a first resistance value. In a second circuit state, the first and second bus lines are connected via an attenuating resistor having a second resistance value. In a third circuit state, the first and second bus lines are connected via an attenuating resistor having a third resistance value. The first resistance value is lower than the second resistance value. The second resistance value is lower than the third resistance value.

16 Claims, 3 Drawing Sheets

(56) References Cited

OTHER PUBLICATIONS

Kim et al., "Ringing Suppression in a Controller Area Network With Flexible Data Rate Using Impedance Switching and a Limiter," IEEE Transactions on Vehicular Technology, vol. 68, No. 11, 2019, pp. 10679-10686.

* cited by examiner

METHOD AND DEVICE FOR ATTENUATING OSCILLATIONS ON BUS LINES OF A BUS SYSTEM BASED ON DIFFERENTIAL VOLTAGE SIGNALS

FIELD

The present invention relates to an attenuating device for a bus system based on differential voltage signals and to a method for attenuating oscillations.

BACKGROUND INFORMATION

In bus systems, in particular in those that transmit signals in the form of voltage differences between two conductive wires, the so-called bus lines, such as the CAN bus (CAN stands for controller area network), oscillations occur over the course of the voltage difference at or after the edges of the differential voltage signal. For example, such oscillations occur in the CAN bus after the transition from a dominant state, representing a voltage difference of nominal 2 V, to a recessive state, representing a voltage difference of nominal 0 V. The oscillations of the bus system are caused by switching operations of the bus signals due to line inductances and input capacitances of the transceivers of the bus system. These voltage oscillations are also referred to as "ringing".

The negative effect of these oscillations is that the maximum bit rate that can be transmitted over the bus is limited because the oscillations increase the timespan until a reliably detectable signal state is assumed after a change in the differential voltage signal. For example, this effect is a major cause that the effective usable bit rate is limited to approximately 2 Mbit/s in a CAN Flexible Data Rate (FD) bus nominally rated at 5 Mbit/s.

In order to increase the effectively usable bit rate, one can therefore attempt to suppress or attenuate the oscillations or the ringing. The revisions in the CAN-FD-SIC (SIC: Signal Improvement Capability) requirements placed on transceivers in the bus system—compared the CAN-FD requirements—for example in particular relate to the attenuation behavior when transitioning from the dominant to the recessive state. For this purpose, the two bus lines can be connected with the lowest possible resistance, i.e., with as little or no impedance as possible, while the voltage oscillations occur. This results in other bus users needing a larger current during this period to generate a voltage difference on the bus.

SUMMARY

According to the present invention, an attenuation device for a bus of a bus system based on differential voltage signals, in particular a controller area network bus system, a method for attenuating oscillations, an associated control apparatus and an attenuation arrangement with the features of the independent claims are provided. Advantageous embodiments of the present invention are disclosed herein.

According to an example embodiment of the present invention, the electrical resistance value between the bus lines can be purposefully controlled for a time period after an edge in the differential voltage signal occurs. On the one hand, this achieves an attenuation of oscillations of the differential voltage and on the other hand, this can ensure that even weak bus subscribers (i.e., bus subscribers that can provide relatively little current to generate a voltage difference on the bus) can generate a voltage difference on the bus to indicate an error (i.e., can send a so-called error flag).

The attenuation device comprises an attenuating circuit, which in a first circuit state connects or short-circuits the bus lines (a first bus line (e.g., CAN_H) and a second bus line (e.g. CAN_L)) to each other by a very low resistance value, whereby the oscillation is strongly attenuated. In a second circuit state, the resistance value is increased so that even weaker bus subscribers can generate a differential voltage on the bus, wherein the resistance value is still small enough to further attenuate the oscillation. In a third circuit state, the bus lines are no longer connected to each other by the attenuation circuit, or only at a very high or infinite resistance value.

The attenuating device also expediently comprises a control circuit that switches the attenuating circuit back and forth between the individual circuit states, e.g., according to control signals.

Particularly advantageously, these different resistance values can be generated by a circuit comprising at least one semiconductor switch. The variable resistance value is particularly advantageously generated by the on-resistance (e.g., $R_{DSon}$) of at least one semiconductor switch, preferably of at least two anti-serially switched semiconductor switches. By variably controlling this at least one semiconductor switch, different resistance values can be generated particularly easily, from a very low resistance (semiconductor switch is switched on) to a very high or infinity resistance (semiconductor switch is normally off).

According to a preferred embodiment of the present invention, the at least one semiconductor switch is a field effect transistor, FET, in particular a MOSFET. Due to their intrinsic scattering capacitances, field effect transistors are particularly well-suited for setting time-variable resistance values.

Preferably, the attenuation circuit comprises a first field effect transistor, FET, having a predetermined gate source capacitance, a second FET having a predetermined gate source capacitance, and a resistor element having a predetermined resistance value, wherein a drain terminal of the first FET is connected to a terminal for the first bus line and a drain terminal of the second FET is connected to a terminal for the second bus line, wherein a source terminal of the first FET and a source terminal of the second FET are connected to a common source terminal point, wherein a gate terminal of the first FET and a gate terminal of the second FET are connected to a common gate terminal point, and wherein the resistor element is connected to the source terminal point and the gate terminal point. Preferably, these are self-latching p channel FETs.

According to an example embodiment of the present invention, further preferably, the control circuit is connected to the gate terminal point and the source terminal point of the attenuating circuit and is adapted to have a voltage terminal, a reference potential terminal and at least one control terminal, wherein the control circuit is adapted to do the following when a voltage is applied to the voltage terminal and a reference potential is applied to the reference potential terminal:

1. connect the source terminal point to the voltage terminal and connect the gate terminal point to the ground terminal when at least one voltage is applied to the at least one control terminal that signals a first state or the first circuit state;
2. open the source terminal point and the gate terminal point in the control circuit when at least one voltage that signals a second state or the second circuit state is applied to the at least one control terminal; and 3. make a low-resistance connection between the source terminal point and the gate terminal point when at least one voltage that signals a third state or the third circuit state is applied to the at least one control terminal ("low-resistance" is to be understood here such that the ohmic resistance of the connection should be small relative to the resistance value of the resistor element, e.g. less than a ⅒ or less than ¹⁄₁₀₀ of the resistance value, that is to say very small, or infinitesimally small).

Unless otherwise noted, the terms "connection", "connected", "connect", etc. refer to electrically conductive connections and should be understood accordingly. As a simplification and for better readability, this application uses the above shorter expressions rather than the expressions "electrically conductive connection", "make an electrically conductive connection", "connect electrically conductively", etc.

When the source terminal point and the gate terminal point are referred to as "opened" or "open" in the control circuit, this means that there is no (electrically conductive) connection between the source terminal point and the gate terminal point made by the control circuit, i.e., these terminal points are disconnected in the control circuit or are only connected at high resistance. Likewise, when the source terminal point and the gate terminal point are switched to "open" in the control circuit, the source terminal point and the gate terminal point are disconnected from the voltage terminal, the reference potential terminal and the at least one control terminal (if a connection to these terminals was present), i.e., there is no (electrically conductive) connection (or only a high-resistance connection) to these terminals within the control circuit. "Disconnected" is to be understood as being analogous to "connected" such that an electrical conductor is disconnected or interrupted.

The three different states (or phases) are signaled or encoded by various configurations of voltage values and/or voltages on one or more control terminals. For example, it is possible to provide a single control terminal that is controlled with three different voltage levels corresponding to the three states.

However, preferably two control terminals are provided, i.e., the attenuating device is adapted such that the at least one control terminal comprises a first and a second control terminal, wherein the first state is signaled when a high-level voltage signal is applied to the first control terminal and no voltage signal is applied to the second control terminal; wherein the second state is signaled when no voltage signals are applied to the first control terminal and to the second control terminal; and wherein the third state is signaled when a high-level voltage signal is applied to the second control terminal and no voltage signal is applied to the first control terminal. This embodiment only requires a distinction as to whether or not a voltage is applied to the respective control terminal. The term "high-level voltage signal" means that the voltage applied to the control terminal should be higher than the voltage applied to the voltage terminal.

According to an example embodiment of the present inventon, preferably, the control circuit comprises first switching elements that are adapted to switch a connection between the voltage terminal and the source terminal point and a connection between the reference potential terminal and the gate terminal point to a conductive state when a high-level voltage signal is applied to the first control terminal, and to switch to a non-conductive state when no voltage signal is applied to the first control terminal; wherein further preferably, the first switching elements comprise a third and a fourth FET, wherein gate terminals of the third and the fourth FET are connected to the first control terminal; wherein, most preferably, a source terminal of the third FET is connected to the voltage terminal, and a drain terminal of the third FET is connected to the source terminal point, and a source terminal of the fourth FET is connected to the reference potential terminal, and a drain terminal of the fourth FET is connected to the gate terminal point.

According to this example embodiment, voltages applied to the control terminals can be used directly to control the first switching elements, which is advantageous because no further circuit elements (such as gate drivers) need to be provided. This also applies to the following design.

Furthermore, according to an example embodiment of the present invention, the control circuit preferably comprises a short circuit, in particular comprising second switching elements adapted to switch a connection between the source terminal point and the gate terminal point to a conductive state when a high-level voltage signal is applied to the second control terminal, and to switch to a non-conductive state when a voltage signal is not applied to the second control terminal.

The second switching elements preferably comprise a fifth and a sixth FET connected in series, wherein gate terminals of the fifth and sixth FET are connected to the second control terminal; wherein most preferably, a source terminal of the fifth FET is connected to a source terminal of the sixth FET, and a drain terminal of the fifth FET is connected to the source terminal point and a drain terminal of the sixth FET is connected to the gate terminal point. A particularly simple design of the control circuit is enabled in conjunction with the previous configuration. The field effect transistors (FETs) are preferably metal oxide field effect transistors (MOSFETs), preferably self-latching n-channel FETs.

Attenuation devices according to any of the preceding embodiments can be used by an inventive method for attenuating oscillations on bus lines of a bus system based on differential voltage signals, in particular a controller area network bus system. The method comprises detecting an edge in the differential voltage signal; providing at least one voltage to the at least one control terminal when the edge is detected, wherein the at least one voltage corresponding to the first state is provided in a first time period, the at least one voltage corresponding to the second state is provided in a second time period that follows the first time period, and the at least one voltage corresponding to the third state is provided in a third time period that is outside the first and the second time periods.

According to an example embodiment of the present invention, the method is preferably used for a falling edge of the differential voltage signal, i.e., the edge is preferably a falling edge of the differential voltage signal, and/or the step of detecting comprises detecting whether the edge is a falling edge. "Falling edge" means the transition (edge) in the voltage signal from a state in which a voltage difference exists to a state in which a voltage difference does not exist. For the CAN bus, this is the transition from the dominant to the recessive state.

The method can be adapted such that when the edge is detected, a high level voltage signal is provided to the first control terminal and no voltage signal is provided to the second control terminal in the first time period, no voltage signal is provided in the second time period at the first and at the second control terminal, and no voltage signal is provided at the first control terminal and a high level voltage signal is provided at the second control terminal in the third time period. Further, the method can comprise providing a voltage at the voltage terminal and a reference potential on the reference potential terminal. Based on the above, the necessary voltages or voltage signals for the above-described embodiment of the attenuating device with two control terminals may be provided or generated.

The control apparatus according to the present invention for an attenuating device comprises connecting elements for connecting to the first and the second bus lines and at least one output, preferably two outputs, for connecting to the at least one control terminal, and is adapted to perform all method steps of an inventive method, wherein predetermined first and second time periods are used.

The control apparatus can be realized as a circuit with transistors and RC elements, wherein the individual switching times or time periods are determined by time constants of the RC elements, and the transistors are correspondingly controlled to generate the voltage signals for the first and second control terminals. The specific design of such a circuit for the control apparatus is at the discretion of the person skilled in the art.

According to an example embodiment of the present invention, the attenuation arrangement comprises a plurality of attenuation devices connected in parallel on the bus lines. The predetermined gate source capacitance and/or the predetermined resistance value of different attenuation devices preferably have different values, wherein more preferably, RC time constants (i.e., time constants of the RC elements formed by the capacitances and resistances, therefore the product of capacitance value and resistance value) of different attenuation devices are different. Irrespective thereof, the attenuation arrangement can further comprise a plurality of control apparatuses respectively connected to one of the plurality of attenuating devices, wherein the first and/or second predetermined time period of at least two control apparatuses is preferably different. By a corresponding choice of gate source capacitances, resistance values, first and second time periods, and combinations thereof, the resistance between the bus lines can be purposefully adjusted, i.e., the attenuation behavior can be purposefully controlled.

Additional advantages and embodiments of the present invention result from the description and the figures.

The present invention is illustrated schematically in the figures on the basis of exemplary embodiments and is described below with reference to the figures.

DETAILED DESCRIPTION OF EXAMPLE EMBODIMENTS

Figure 1:
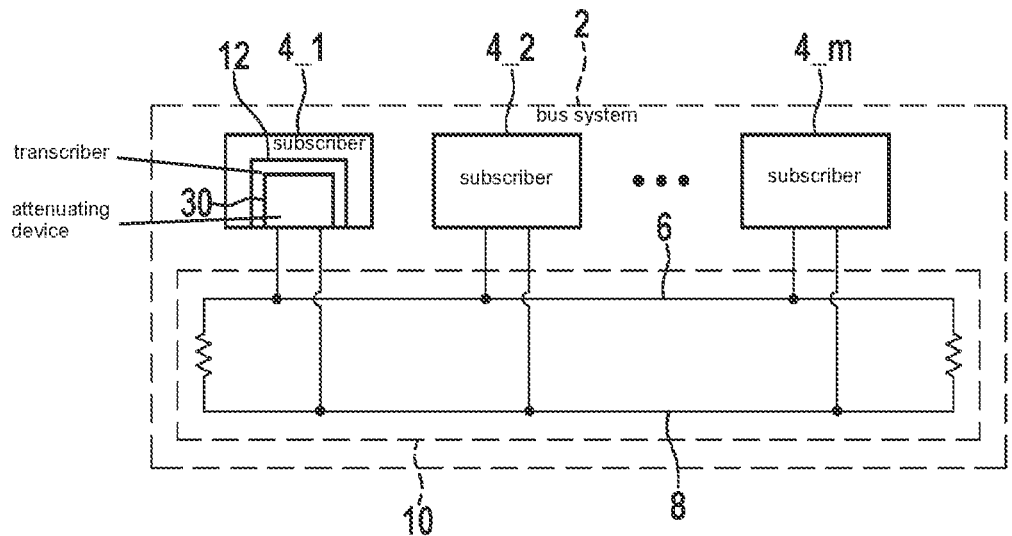
FIG. 1 shows the schematic construction of a bus system according to an example embodiment of the present invention.

FIG. 1 shows the structure of a bus system 2 based on differential voltage signals, in particular a CAN bus system.

Bus system 2 comprises a plurality of bus subscribers 4_1, 4_2, ..., 4_m connected to two bus lines 6, 8 of a bus 10 of the bus system and communicating with each other over the bus lines. For this purpose, the bus subscribers use differential voltages between the two bus lines that are generated and read by means of transceivers. In the figure, one of the bus subscribers 4_1, more precisely its transceiver 12, comprises an attenuating device 30 according to the present invention; in general several or all of the bus subscribers can comprise such an attenuating device 30. The bus lines 6, 8 are connected to each other by terminating resistors 14a, 14b, which represent the central impedance of the bus system.

Figure 2:
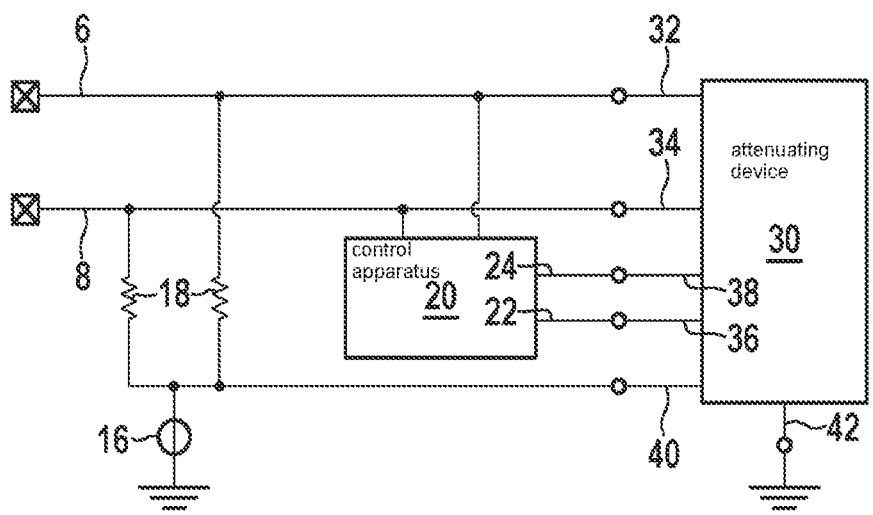
FIG. 2 shows a block diagram with an attenuation device connected to bus lines.

FIG. 2 is a block diagram showing a simplified representation of an inventive attenuating device 30 connected to the bus lines 6, 8. The attenuating device 30 comprises connections 32, 34 to a first bus line 6 and to a second bus line 8, respectively. In the CAN bus, the first bus line 6 corresponds to CAN_H and the second bus line 8 corresponds to CAN_L. As further connections, the attenuating device comprises control terminals 36, 38, by which the function of the attenuating device is controlled, a voltage terminal 40 and a reference potential terminal 42, for connecting to a reference potential, in particular to ground or earth. The voltage terminal 40 is connected to an (ideal) voltage source 16 that provides a constant voltage and is also connected to the bus lines by resistors 18. In the case of a CAN bus, the voltage supplied by the voltage source is nominally 2.5 V, and is the voltage applied to both bus lines in the recessive state (when no bus user generates a difference voltage) or the common mode voltage (i.e., the average value of the two voltages on the first and second bus lines) in the dominant state, respectively.

FIG. 2 also shows a control apparatus 20 connected to the two bus lines 6, 8 and to the two control terminals 36, 38 of the attenuating device 30 and that is adapted to control the attenuating device 30 by providing suitable voltage signals to the control terminals 36, 38 of the attenuating device 30. The control apparatus 20 is adapted to detect an edge in the differential voltage signal on the bus lines, in particular, a falling edge is to be detected, i.e. an edge that occurs when transitioning from the state in which a voltage difference exists to the state in which no voltage difference exists. On the CAN bus, the control apparatus is thus adapted to detect the edge in the differential voltage signal on the transition from the dominant to the recessive state. The control apparatus 30 is further adapted to provide control voltages for the attenuating device 30 at corresponding outputs 22, 24 that are to be connected to the two control terminals 36, 38 of the attenuating device 30. Voltages corresponding to three different configurations and states are in this case applied to the outputs 22, 24. Voltages corresponding to a first state are applied during a first phase extending over a first time period directly after detecting a falling edge, voltages corresponding to a second state are applied during a second phase extending over a second period of time following the first time period, and voltages corresponding to a third state are applied during the remaining time, i.e., outside of the first and the second time period. The third state signals that the attenuating effect of the attenuation device is to be switched off.

Figure 3:
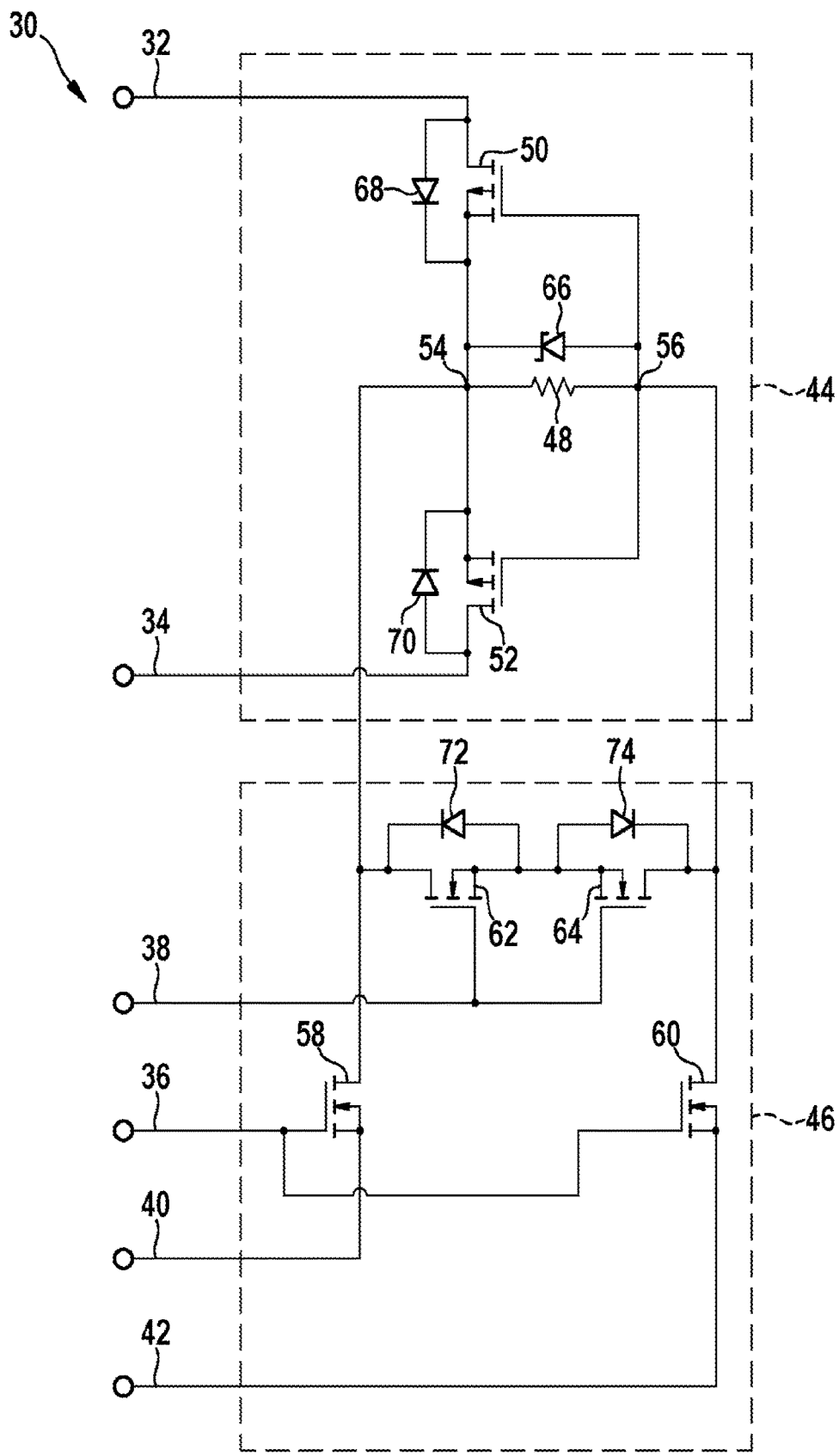
FIG. 3 shows the circuit diagram of an attenuating device according to a preferred example embodiment of the present invention.

FIG. 3 shows a preferred embodiment of an inventive attenuating device 30. The attenuating device includes an attenuating circuit 44 and a control circuit 46.

The attenuating circuit 44 includes a first terminal 32 for a first bus line 6 of the bus and a second terminal 34 for a second bus line 8 of the bus. The attenuating circuit 44 further comprises a resistor element 48, hereinafter also referred to as a resistor 48, a first field effect transistor (FET) 50, and a second field effect transistor 52. Preferably, the two field effect transistors (FETs) 50, 52 are metal oxide field effect transistors (MOSFETs), further preferably p channel MOSFETs of the enrichment type (i.e., normally off). These elements are connected to each other by means of lines such that source terminals of the first and second FETs 50, 52 are connected to a source terminal point 54, gate terminals of first and second FETs 50, 52 are connected to a gate terminal point 56, the source terminal point 54 is connected to the gate terminal point 56 by the resistor 48, the drain terminal of the first FET 50 is connected to the first terminal 32 and the drain terminal of the second FET 52 is connected to the second terminal 34. The first and second FETs 50, 52 each have a predetermined gate source capacitance. Bulk drain diodes 68, 70 of the first and second FETs 50, 52 are also shown for the sake of completeness.

The control circuit 46 comprises a voltage terminal 40, a reference potential terminal 42, and a first and second control terminal 36, 38. The control circuit 46 comprises a third and a fourth FET 58, 60, the gate terminals of which are connected to the first control terminal 36 and which are preferably MOSFETs, further preferably n-channel MOSFETs of the enrichment type (i.e., normally off). The third and fourth FETs represent first switching elements. The third FET 58 is arranged to switch a connection from the voltage terminal 40 to the source terminal point 54 back and forth between a conductive and a non-conductive state. The fourth FET 60 is arranged to switch a connection from the reference potential terminal 42 to the gate terminal point 56 back and forth between a conductive and a non-conductive state. More specifically, the source terminal of the third FET 58 is connected to the voltage terminal 40 and the drain terminal of the third FET 58 is connected to the source terminal point 54, and the source terminal of the fourth FET 60 is connected to the reference potential terminal 42 and the drain terminal of the fourth FET 60 is connected to the gate terminal point 56. Thus, when a high-level voltage is applied to the first control terminal 36, the third and fourth FETs 58, 60 are switched on. High-level voltage is to be understood herein to be sufficiently high relative to voltages on voltage terminal 40 and on reference potential terminal 42 to switch on the third and fourth FETs 58, 60. The expressions "switched on" or "switched through" are to be understood as indicating that the FET is operated in the saturation range.

Further, the control circuit 46 comprises fifth and sixth FETs 62, 64, the gate terminals of which are connected to the second control terminal 38 and which are preferably MOSFETs, further preferably n-channel MOSFETs of the enrichment type (i.e., normally off). The fifth and sixth FETs represent second switching elements. The fifth and sixth FETs 62, 64 are arranged in series such that a connection between the source terminal point 54 and the gate terminal point 56 can be switched between a conductive and a non-conductive state. Thus, when a high-level voltage is applied to the second control terminal 38, the fifth and sixth FETs 62, 64 control through. More specifically, the drain terminal of the fifth FET 62 is connected to the source terminal point 54, the drain terminal of the sixth FET 64 is connected to the gate terminal point 56, and the source terminals of the fifth and sixth FETs 62, 64 are connected to each other. The bulk drain diodes 72, 74 of the fifth and sixth FETs 62, 64 are again shown for the sake of completeness. It should be emphasized, however, that any controllable short-circuit can be used at this point.

All FETs, i.e. the first to sixth FETs, are preferably adapted or embodied as high-voltage transistors according to maximum rated voltages of the bus, or from −27 V to +40 V on the CAN bus, e.g. CAN_H, CAN_L.

By referencing the configurations or states of the control voltages introduced above, the following describes the operating principles of the attenuating circuit shown in FIG. 3, wherein it is implied that voltage terminal 40 is connected to a suitable voltage source that provides a voltage preferably corresponding to the common mode voltage of the two bus lines and that the reference potential terminal 42 is connected to a suitable reference potential, in particular a ground potential.

First state (or first phase): When a high-level voltage signal is applied to the first control terminal 36 and no voltage is applied to the second control terminal 38, the third and fourth FETs 58, 60 are switched on such that the source terminal point 54 is brought to the potential applied to the voltage terminal 40, and the gate terminal point 56 is brought to the potential at the reference potential point 42 (which are given according to the aforementioned condition). At the same time, the fifth and sixth FETs 62, 64 are latched. This results in a gate source voltage being applied to the first and second FETs 50, 52, respectively, so that the two FETs 50, 52 are switched through, i.e. have only a very low or no resistance over the drain source paths. Accordingly, the two bus lines 6, 8 are short-circuited by the FETs connected in series, wherein the short-circuit resistor forming the attenuation resistor is determined by the sizing of the first and second FETs 50, 52. Oscillations are strongly attenuated, i.e., the ringing is suppressed by the low resistance between the bus lines.

Second state (or second phase): When voltages are not applied on the first control terminal 36 and the second control terminal 38, the drain source paths of the third, fourth, fifth and sixth FETs 58, 60, 62, 64 are non-conductive. There is then no conductive connection made by control circuit 46 between source terminal point 54 and gate terminal point 56, and they are also disconnected from the voltage terminal 40 and reference potential terminal 42 (and due to circuit layout, are disconnected from control terminals 36, 38), i.e., the source terminal point 54 and gate terminal point 56 are open in control circuit 46. The charges of the capacitors formed by the gate source capacitances of the first and second FETs 50, 52 are then discharged over the resistor 48 such that the voltage between the gate terminal point 56 and the source terminal point 54 decreases. Due to the decreasing gate source voltage at the first and second FETs 50, 52, the latter are no longer in the saturation range but in the linear or ohmic range, so that the drain source paths determining the attenuation resistance between the bus lines have a resistance dependent on the gate source voltage. Accordingly, the time characteristic of the resulting attenuation resistance is determined by the RC time constant resulting from the values C of the gate source capacitances of the first and second FETs 50, 52 and the value R of the resistance 48.

Third state (or third phase): When voltage is not applied to the first control terminal 36 and a high-level voltage signal is applied to the second control terminal 38, the fifth and sixth FETs 62, 64 are switched through, wherein the third and fourth FETs 58, 60 are at the same time latched. This results in the source terminal point 54 and the gate terminal point 56 being connected with low or no resistance. This connection has a low resistance connection in the sense that the resistance of this connection is small compared to the resistance value of the resistor 48; the charges at the gate source capacitances of the first and second FETs 50, 52 thus discharge over this connection such that the first and second FETs 50, 52 are latched. The bus lines are thus only connected at high resistance over the attenuating device, i.e. with high resistance or non-conducting.

Obviously, a high-level voltage signal should not be applied to the first and second control terminals 36, 38 at the same time, since the voltage terminal 40 would then be directly connected to the reference potential terminal 42. A control apparatus 20 should be adapted accordingly.

Figure 4A:
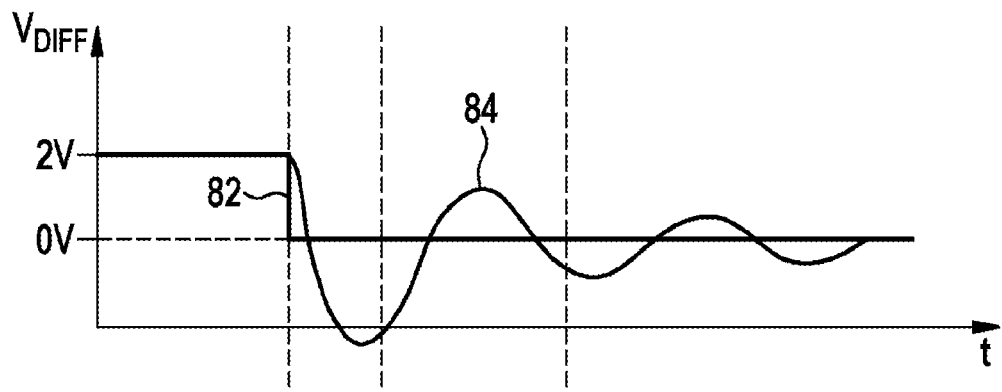
FIGS. 4A-4C show the effect of an attenuating device, according to an example embodiment of the present invention, on the differential voltage and the resistance between the bus lines.
Figure 4B:
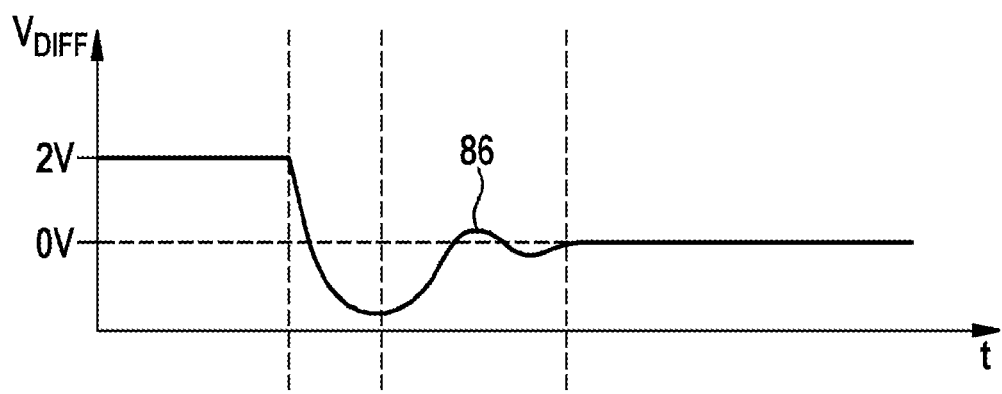
Figure 4C:
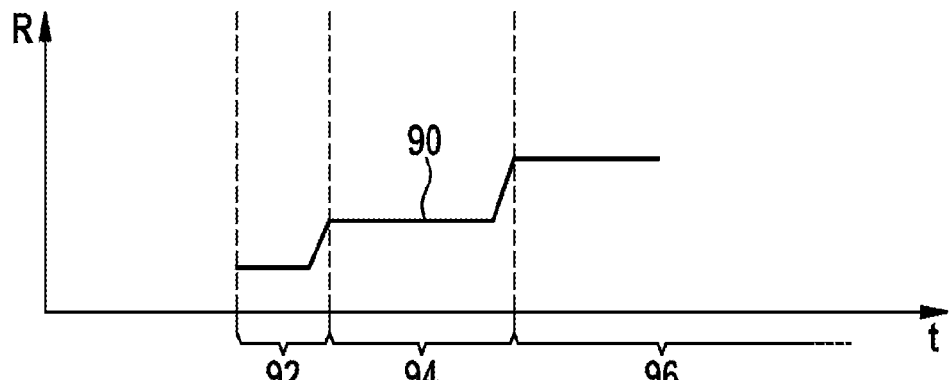

FIGS. 4A-4C illustrate the effect of an inventive attenuating circuit. FIG. 4A firstly shows the behavior when no attenuating circuit is used, wherein the difference voltage $V_{diff}$ between the bus lines is plotted over time t. Both the ideal curve 82 and the real curve 84 of the differential stress are plotted in the figure. The ideal curve 82 follows a stepwise course in which the differential voltage transitions from a positive value (e.g. 2 V in the CAN bus) to a value of 0 V. The real curve 84, on the other hand, has oscillations (ringing) generated at the edge of the ideal curve that are attenuated to a negligible value only after a few oscillation periods.

FIG. 4B shows the attenuated curve 86, i.e., the curve of the real differential voltage signal when an attenuation circuit is used. Here, the oscillation is substantially attenuated to relatively small amplitudes after only one oscillation period. For a receiver on the bus, the state of 0 V is therefore already unambiguously distinguishable much earlier.

FIG. 4C shows the curve 90 of the resistance adjusted by the attenuation circuit (according to the present invention) between the two bus lines, wherein only the basic curve, i.e. whether the resistance in a phase is greater than or less than in another, is outlined and no information can be read from the figure about the absolute magnitude. Likewise, the resistances may not be constant during a phase; this is particularly the case during the second phase, in which the first and second transistors act as voltage-controlled resistors and the gate source voltage decreases according to the RC time constant defined by the gate source capacitances and the resistor element. During the first phase 92 (first state or time period, i.e. first and second transistor are switched on), the bus lines are connected to one another or short-circuited by a very low resistance of the attenuating circuit, thus greatly attenuating the oscillations (because the resistance R also results in a correspondingly small time constant RC). During the second phase 94 (second state or time period, i.e. the first and second transistors act as voltage-controlled resistors), the resistance is increased by the attenuating circuit, so that weaker bus subscribers can also generate a differential voltage on the bus, wherein the resistance is at the same time still small enough to further attenuate the oscillation. In the further course or during the third phase 96 (third state or time period, i.e., first and second transistors are latched), the bus lines are no longer connected to each other by the attenuating circuit, or only connected at a very high resistance. The first to third phase corresponds to the first to third state of the control voltages introduced above.

What is claimed is:

1. An attenuation device for a controller area network bus of a bus system based on differential voltage signals, the bus including a first bus line and a second bus line, comprising:
   an attenuating circuit that provides a variable electrical resistance value between the first bus line and the second bus line and that is operable in at least three circuit states, wherein in a first circuit state, the first bus line and the second bus line are connected by an attenuation resistor having a first resistance value, in a second circuit state the first bus line and the second bus line are connected by the attenuation resistor having a second resistance value, and in a third circuit state the first bus line and the second bus line are connected by the attenuation resistor having a third resistance value;
   wherein the first resistance value is less than the second resistance value, and the second resistance value is less than the third resistance value, and
   wherein the second resistance value is a time-variable resistance value.

2. The attenuation device according to claim 1, wherein the second resistance value increases with time.

3. The attenuation device according to claim 1, wherein the attenuation resistor having the first resistance value and/or having the second resistance value and/or having the third resistance value is implemented as a circuit including at least one semiconductor switch.

4. The attenuation device according to claim 1, further comprising:
   a control circuit having at least one control terminal that switches the attenuating circuit back and forth between the circuit states according to control signals on the at least one control terminal.

5. An attenuation device for a controller area network bus of a bus system based on differential voltage signals, the bus including a first bus line and a second bus line, comprising:
   an attenuating circuit that provides a variable electrical resistance value between the first bus line and the second bus line and that is operable in at least three circuit states, wherein in a first circuit state, the first bus line and the second bus line are connected by an attenuation resistor having a first resistance value, in a second circuit state the first bus line and the second bus line are connected by the attenuation resistor having a second resistance value, and in a third circuit state the first bus line and the second bus line are connected by the attenuation resistor having a third resistance value;
   wherein the first resistance value is less than the second resistance value, and the second resistance value is less than the third resistance value,
   wherein the attenuating circuit comprises:
   a first field effect transistor (FET) having a predetermined gate source capacitance, a second FET having a predetermined gate source capacitance and a resistor element having a predetermined resistance value, wherein a drain terminal of the first FET is connected to a terminal for the first bus line and a drain terminal of the second FET is connected to a terminal for the second bus line, wherein a source terminal of the first FET and a source terminal of the second FET are connected to a common source terminal point, wherein a gate terminal of the first FET and a gate terminal of the second FET are connected to a common gate terminal point, and wherein the resistor element is connected to the source terminal point and the common gate terminal point.

6. The attenuation device according to claim 5, wherein the control circuit is connected to the common gate terminal point and the source terminal point of the attenuating circuit and includes a voltage terminal and a reference potential terminal, and
   wherein the control circuit is adapted to do as follows when a voltage is applied to the voltage terminal and a reference potential is applied to the reference potential terminal:
   connecting the source terminal point to the voltage terminal and connect the common gate terminal point to the reference potential terminal when at least one voltage that signals the first circuit state is applied to the at least one control terminal;

switching the source terminal point and the common gate terminal point open in the control circuit when at least one voltage that signals the second circuit state is applied to the at least one control terminal;

making a low-resistance connection between the source terminal point and the common gate terminal point when at least one voltage that signals the third circuit state is applied to the at least one control terminal.

7. The attenuation device according to claim 6, wherein the at least one control terminal includes a first control terminal and a second control terminal, wherein the first circuit state is signaled by a high level voltage signal applied to the first control terminal and a voltage signal is not applied to the second control terminal, wherein the second circuit state is signaled when no voltage signals are applied to the first control terminal and the second control terminal, and wherein the third circuit state is signaled when a high-level voltage signal is applied to the second control terminal and a voltage signal is not applied to the first control terminal.

8. The attenuation device according to claim 5, wherein the control circuit includes first switching elements that are adapted to switch a connection between the voltage terminal and the source terminal point and a connection between the reference potential terminal and the gate terminal point to a conductive state when a high-level voltage signal is applied to the first control terminal, and to switch said connections to a non-conductive state when no voltage signal is applied to the first control terminal, wherein the first switching elements include a third FET and a fourth FET, wherein gate terminals of the third FET and the fourth FET are connected to the first control terminal, wherein a source terminal of the third FET is connected to the voltage terminal and a drain terminal of the third FET is connected to the source terminal point, and a source terminal of the fourth FET is connected to the reference potential terminal and a drain terminal of the fourth FET is connected to the gate terminal point.

9. The attenuation device according to claim 7, wherein the control circuit includes second switching elements adapted to switch a connection between the source terminal point and the gate terminal point to a conductive state when a high-level voltage signal is applied to the second control terminal, and to switch said connections to a non-conductive state when a voltage signal is not applied to the second control terminal, wherein the second switching elements include fifth and sixth FETs connected in series, wherein gate terminals of the fifth and sixth FETs are connected to the second control terminal, wherein a source terminal of the fifth FET is connected to a source terminal of the sixth FET, and a drain terminal of the fifth FET is connected to the source terminal point and a drain terminal of the sixth FET is connected to the gate terminal point.

10. A method for attenuating oscillations on bus lines of a controller area network bus system based on differential voltage signals, using an attenuation device, the method comprising:

detecting an edge in a differential voltage signal;

providing, when the edge is detected, at least one voltage to at least one control terminal, wherein:

in a first time period, the at least one voltage is provided corresponding to a first circuit state, in a second time period that follows the first time period, the at least one voltage is provided corresponding to a second circuit state, and in a third time period that is outside of the first and the second time period, the at least one voltage is provided corresponding to a third circuit state, and wherein the attenuation device includes:

an attenuating circuit that provides a variable electrical resistance value between a first bus line of the bus and a second bus line of the bus, and that is operable in at least three circuit states, wherein in the first circuit state, the first bus line and the second bus line are connected by an attenuation resistor having a first resistance value, in the second circuit state the first bus line and the second bus line are connected by the attenuation resistor having a second resistance value, and in the third circuit state the first bus line and the second bus line are connected by the attenuation resistor having a third resistance value, wherein the first resistance value is less than the second resistance value, and the second resistance value is less than the third resistance value.

11. The method according to claim 10, wherein the edge is a falling edge of the differential voltage signal.

12. The method according to claim 10, wherein the attenuating circuit further includes:

a control circuit having the at least one control terminal that switches the attenuating circuit back and forth between the circuit states according to control signals on the at least one control terminal;

wherein the control circuit is connected to a common gate terminal point and a source terminal point of the attenuating circuit and includes a voltage terminal and a reference potential terminal, wherein the attenuation device further includes a first field effect transistor (FET) having a predetermined gate source capacitance, a second FET having a predetermined gate source capacitance and a resistor element having a predetermined resistance value, wherein a drain terminal of the first FET is connected to a terminal for the first bus line and a drain terminal of the second FET is connected to a terminal for the second bus line, wherein the source terminal of the first FET and the source terminal of the second FET are connected to the common source terminal point, wherein a gate terminal of the first FET and a gate terminal of the second FET are connected to a common gate terminal point, wherein the resistor element is connected to the source terminal point and the common gate terminal point, and wherein the control circuit, when a voltage is applied to the voltage terminal and a reference potential is applied to the reference potential terminal, is configured to perform the following:

connecting the source terminal point to the voltage terminal and connect the common gate terminal point to the reference potential terminal when at least one voltage that signals the first circuit state is applied to the at least one control terminal;

switching the source terminal point and the common gate terminal point open in the control circuit when at least one voltage that signals the second circuit state is applied to the at least one control terminal;

making a low-resistance connection between the source terminal point and the common gate terminal point when at least one voltage that signals the third circuit state is applied to the at least one control terminal;
wherein the at least one control terminal includes a first control terminal and a second control terminal, wherein the first circuit state is signaled by a high level voltage signal applied to the first control terminal and a voltage signal is not applied to the second control terminal; wherein the second circuit state is signaled when no voltage signals are applied to the first control terminal and the second control terminal; and wherein the third circuit state is signaled when a high-level voltage signal is applied to the second control terminal and a voltage signal is not applied to the first control terminal, and
wherein, when the edge is detected, in the first period of time, a high-level voltage signal is provided at the first control terminal and a voltage signal is not provided at the second control terminal, in a second period of time, no voltage signals are provided at the first and at the second control terminal, and in the third period of time, no voltage signal is provided at the first control terminal and a high-level voltage signal is provided at the second control terminal.

13. A control apparatus for an attenuation device for a controller area network bus of a bus system based on differential voltage signals, the bus including a first bus line and a second bus line, comprising:
terminal elements for connecting to the first and the second bus lines and at least one output, for connecting to the at least one control terminal, and
wherein the control apparatus that is configured to perform the following:
detecting an edge in a differential voltage signal;
providing, when the edge is detected, at least one voltage to at least one control terminal, wherein:
in a first time period, the at least one voltage is provided corresponding to a first circuit state, and
in a second time period that follows the first time period, the at least one voltage is provided corresponding to a second circuit state;
wherein the edge is a falling edge of the differential voltage signal;
wherein the attenuation device includes:
an attenuating circuit that provides a variable electrical resistance value between the first bus line and the second bus line and that is operable in at least three circuit states, wherein in the first circuit state, the first bus line and the second bus line are connected by an attenuation resistor having a first resistance value, in the second circuit state the first bus line and the second bus line are connected by the attenuation resistor having a second resistance value, and in a third circuit state the first bus line and the second bus line are connected by the attenuation resistor having a third resistance value, wherein the first resistance value is less than the second resistance value, and the second resistance value is less than the third resistance value; and
a control circuit having the at least one control terminal that switches the attenuating circuit back and forth between the circuit states according to control signals on the at least one control terminal.

14. An attenuation apparatus, comprising:
a plurality of attenuation devices, each of the attenuation devices being configured for a controller area network bus of a bus system based on differential voltage signals, the bus including a first bus line and a second bus line;
wherein each of the attenuation devices include:
an attenuating circuit that provides a variable electrical resistance value between the first bus line and the second bus line and that is operable in at least three circuit states, wherein in a first circuit state, the first bus line and the second bus line are connected by an attenuation resistor having a first resistance value, in a second circuit state the first bus line and the second bus line are connected by the attenuation resistor having a second resistance value, and in a third circuit state the first bus line and the second bus line are connected by the attenuation resistor having a third resistance value, wherein the first resistance value is less than the second resistance value, and the second resistance value is less than the third resistance value;
wherein the second resistance value is a time-variable resistance value, and
wherein the attenuation devices are connected in parallel on the first and second bus lines.

15. An attenuation apparatus, comprising:
a plurality of attenuation devices, each of the attenuation devices being configured for a controller area network bus of a bus system based on differential voltage signals, the bus including a first bus line and a second bus line;
wherein each of the attenuation devices include:
an attenuating circuit that provides a variable electrical resistance value between the first bus line and the second bus line and that is operable in at least three circuit states, wherein in a first circuit state, the first bus line and the second bus line are connected by an attenuation resistor having a first resistance value, in a second circuit state the first bus line and the second bus line are connected by the attenuation resistor having a second resistance value, and in a third circuit state the first bus line and the second bus line are connected by the attenuation resistor having a third resistance value, wherein the first resistance value is less than the second resistance value, and the second resistance value is less than the third resistance value;
wherein the attenuation devices are connected in parallel on the first and second bus lines, and
wherein the attenuating circuit includes:
a control circuit having at least one control terminal that switches the attenuating circuit back and forth between the circuit states according to control signals on the at least one control terminal;
wherein the control circuit is connected to the common gate terminal point and the source terminal point of the attenuating circuit and includes a voltage terminal and a reference potential terminal,
wherein each of the attenuation devices further includes a first field effect transistor (FET) having a predetermined gate source capacitance, a second FET having a predetermined gate source capacitance and a resistor element having a predetermined resistance value,
wherein a drain terminal of the first FET is connected to a terminal for the first bus line and a drain terminal of the second FET is connected to a terminal for the second bus line,
wherein a source terminal of the first FET and a source terminal of the second FET are connected to a common source terminal point, wherein a gate terminal of the first FET and a gate terminal of the second FET are connected to a common gate terminal point, wherein the resistor element is connected to the source terminal point and the common gate terminal point, wherein the control circuit, when a voltage is applied to the voltage terminal and a reference potential is applied to the reference potential terminal, is configured to perform the following:

connecting the source terminal point to the voltage terminal and connect the common gate terminal point to the reference potential terminal when at least one voltage that signals the first circuit state is applied to the at least one control terminal;

switching the source terminal point and the common gate terminal point open in the control circuit when at least one voltage that signals the second circuit state is applied to the at least one control terminal;

making a low-resistance connection between the source terminal point and the common gate terminal point when at least one voltage that signals the third circuit state is applied to the at least one control terminal, and wherein the predetermined gate source capacitance and/or the predetermined resistance value of different ones of the attenuation devices have different values.

16. An attenuation apparatus, comprising:

a plurality of attenuation devices, each of the attenuation devices being configured for a controller area network bus of a bus system based on differential voltage signals, the bus including a first bus line and a second bus line;

wherein each of the attenuation devices include:
an attenuating circuit that provides a variable electrical resistance value between the first bus line and the second bus line and that is operable in at least three circuit states, wherein in a first circuit state, the first bus line and the second bus line are connected by an attenuation resistor having a first resistance value, in a second circuit state the first bus line and the second bus line are connected by the attenuation resistor having a second resistance value, and in a third circuit state the first bus line and the second bus line are connected by the attenuation resistor having a third resistance value, wherein the first resistance value is less than the second resistance value, and the second resistance value is less than the third resistance value;

wherein the attenuation devices are connected in parallel on the first and second bus lines, and a plurality of control apparatuses, each of the control apparatuses including:
terminal elements for connecting to the first and the second bus lines and at least one output, for connecting to the at least one control terminal, and for performing the following:
detecting an edge in a differential voltage signal;
providing, when the edge is detected, at least one voltage to the at least one control terminal, wherein:
in a first time period, the at least one voltage is provided corresponding to the first circuit state, and
in a second time period that follows the first time period, the at least one voltage is provided corresponding to the second circuit state;

wherein the edge is a falling edge of the differential voltage signal, and wherein each of the control apparatuses is connected to one of the plurality of attenuation devices, wherein the first and/or second predetermined time period of at least two different control apparatuses is different for each of the control apparatuses.

* * * * *